(12) United States Patent
Bauer et al.

(10) Patent No.: US 7,470,601 B2
(45) Date of Patent: Dec. 30, 2008

(54) SEMICONDUCTOR DEVICE WITH SEMICONDUCTOR CHIP AND ADHESIVE FILM AND METHOD FOR PRODUCING THE SAME

(75) Inventors: Michael Bauer, Nittendorf (DE); Ludwig Heitzer, Regensburg (DE); Eric Kuerzel, Regensburg (DE); Peter Strobel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 14 days.

(21) Appl. No.: 11/543,983

(22) Filed: Oct. 6, 2006

(65) Prior Publication Data

US 2007/0082463 A1 Apr. 12, 2007

(30) Foreign Application Priority Data

Oct. 6, 2005 (DE) .................. 10 2005 048 153

(51) Int. Cl.
*H01L 21/00* (2006.01)

(52) U.S. Cl. .................. 438/462; 438/113; 438/464; 257/620; 257/E21.523

(58) Field of Classification Search .................. 438/462, 438/464, 113
See application file for complete search history.

(56) References Cited

U.S. PATENT DOCUMENTS 7,205,211 B2 * 4/2007 Aspar et al. .................. 438/458
7,294,521 B2 * 11/2007 Yoo ............................. 438/46
2008/0003720 A1 * 1/2008 Lu et al. ....................... 438/113

FOREIGN PATENT DOCUMENTS

| DE | 102004054147 A1 | 2/2006 |
|----|------|--------|
| GB | 2404280 A | 1/2005 |
| JP | 2004193241 AA | 7/2004 |
| WO | WO 2005/083779 A1 | 9/2005 |

* cited by examiner

*Primary Examiner*—Matthew Smith
*Assistant Examiner*—Phillip Green
(74) *Attorney, Agent, or Firm*—Edell, Shapiro & Finnan, LLC

(57) ABSTRACT

A semiconductor device includes a semiconductor chip and an adhesive film between the back side of the semiconductor chip and a chip pad of a leadframe. The adhesive film includes a film core and adhesive layers that cover both sides of the film core. The film core includes a brittle, fragile hard material.

6 Claims, 4 Drawing Sheets

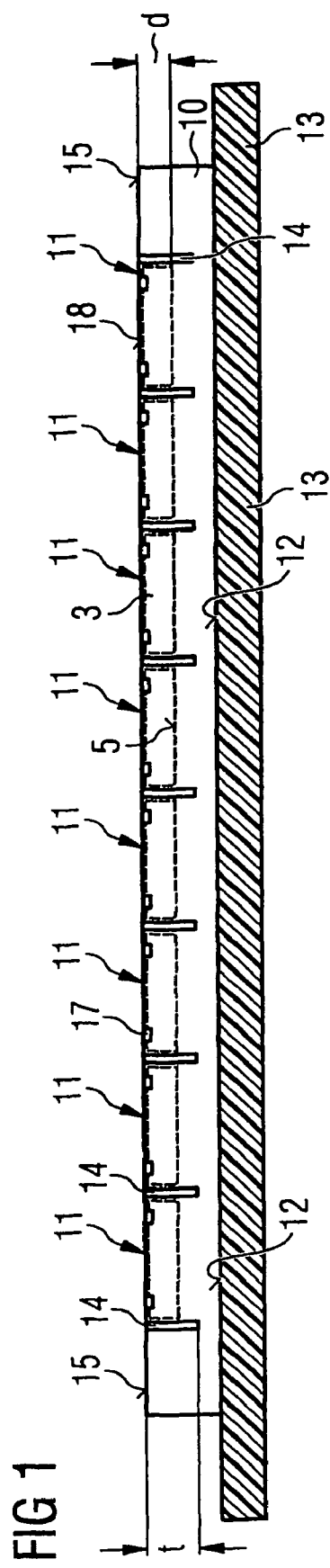
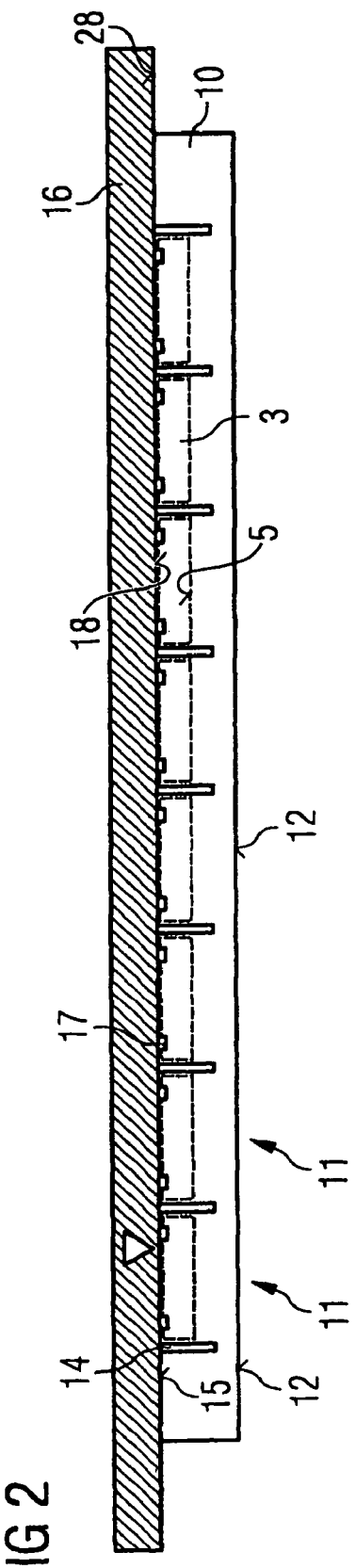

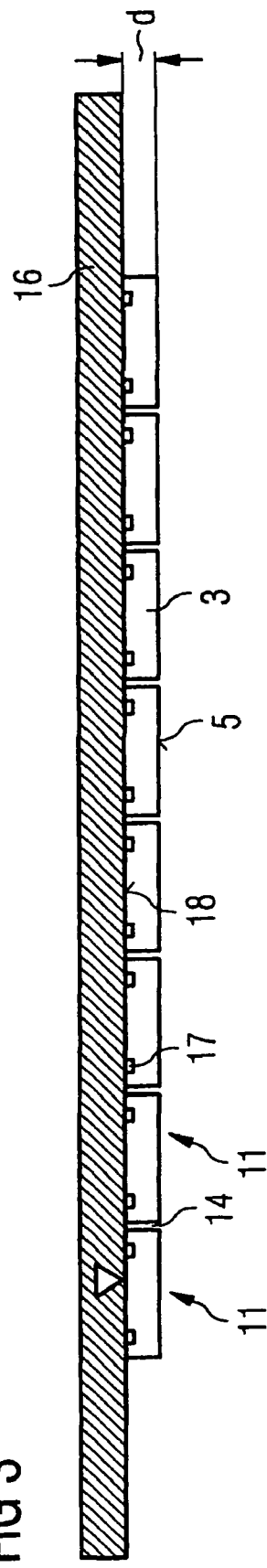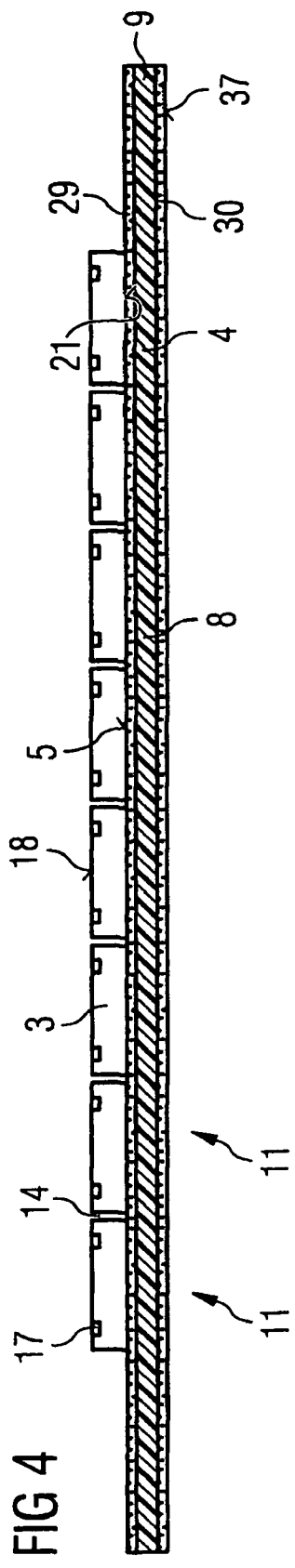

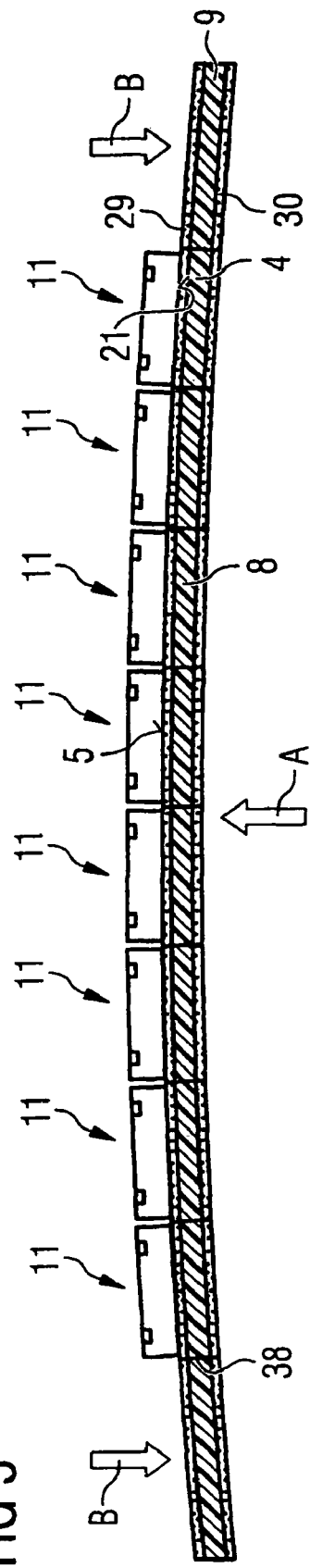
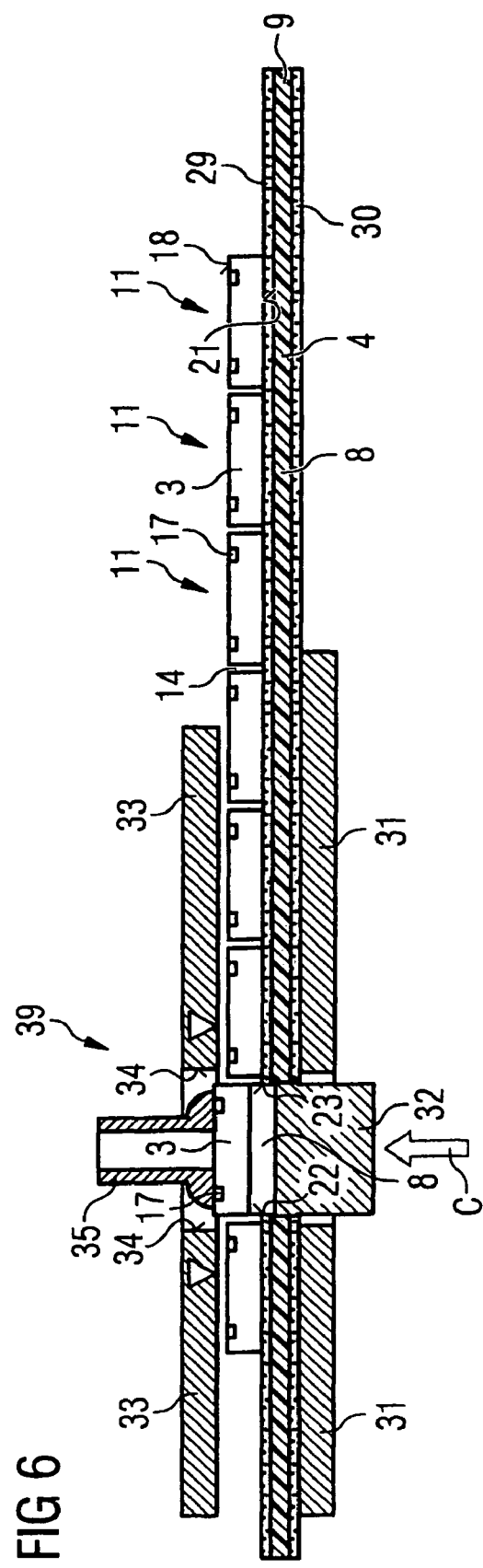

SEMICONDUCTOR DEVICE WITH SEMICONDUCTOR CHIP AND ADHESIVE FILM AND METHOD FOR PRODUCING THE SAME

CROSS REFERENCE TO RELATED APPLICATIONS

This application claims priority under 35 U.S.C. §119 to Application No. DE 102005048153.1 filed on Oct. 6, 2005, entitled "Semiconductor Device with Semiconductor Chip and Adhesive Film and Method for Producing the Same," the entire contents of which are hereby incorporated by reference.

BACKGROUND

Methods are known for bonding an adhesive film to a semiconductor chip. For example, such methods involve removing a structure which includes a semiconductor wafer from a wafer carrier. In particular, the semiconductor wafer is severed by a laser beam, and an adhesive layer is also severed at the same time such that individual semiconductor chips to which the parts of adhesive film remain attached can be picked up from the wafer carrier. Subsequently, the parts of adhesive film severed via the laser, along with the semiconductor chip, can be fixed on a chip pad of a leadframe in a pick-and-place machine.

This method has the disadvantage that the singulation of the adhesive layer requires severing with laser ablation. The laser ablation entails the risk that both the edge sides and the active upper side of the semiconductor chip become contaminated with evaporating adhesive material.

In other cases, the semiconductor wafer with a corresponding adhesive film is severed via saw blades. The diamond-tipped saw blades which sever the semiconductor wafer become soiled by the adhesive film such that a premature exchange of the diamond-tipped saw blades is required. In addition, here, too, the edges and upper sides of the semiconductor chip are not protected from contamination by the material of the adhesive film. Furthermore, sawing through two materials that are so different can lead to microcracks in the semiconductor material of the semiconductor wafer.

Another known method involves applying the adhesive film to a sawed semiconductor wafer only after severing of the semiconductor chips, and the film is severed in a subsequent process via a laser method. With this separate performance of the separating operations, in that the semiconductor wafer material is sawed first and the adhesive film is subsequently severed by a laser method, problems arise due to contamination by the evaporating adhesive material.

SUMMARY

In a semiconductor device with a semiconductor chip, an adhesive film can be arranged between the back side of the semiconductor chip and a chip pad of a lead frame. The adhesive film initially may not be attached to the chip pad; instead, the back side of the semiconductor chip can be provided with such an adhesive film. The application of such an adhesive film to the back side of the semi-conductor chip need not take place on individual back sides of the semiconductor chips but rather simultaneously for a number of semiconductor chips on the back side of a semiconductor wafer with a high number of semiconductor chip positions.

In particular, an adhesive film can be disposed between the back side of the semiconductor chip and a chip pad of a leadframe. The adhesive film includes a film core, which is a brittle, fragile, hard material, and adhesive layers that cover both sides of the film core. An apparatus, for producing the semiconductor device, which includes an edge bending device is described. An apparatus, for producing the semiconductor device, which includes a semiconductor wafer holder and a punch, is also described. A method for producing a plurality of semiconductor chips and a method for producing a plurality of semiconductor devices is also described below.

The above and still further features and advantages of the present device will become apparent upon consideration of the following definitions, descriptions and descriptive figures of specific embodiments thereof, wherein like reference numerals in the various figures are utilized to designate like components. While these descriptions go into specific details of the described devices, it should be understood that variations may and do exist and would be apparent to those skilled in the art based on the descriptions herein.

BRIEF DESCRIPTION OF THE DRAWINGS

The invention is explained in more detail below with reference to exemplary embodiments, where:

FIGS. 1 to 6 show basic diagrams of the production of a semiconductor chip with an adhesive film;

FIG. 1 shows a schematic cross section through a semiconductor wafer with semiconductor device positions after introducing separating joins;

FIG. 2 shows a schematic cross section through the semiconductor wafer according to FIG. 1 after applying the semiconductor wafer to a semiconductor wafer carrier;

FIG. 3 shows a schematic cross section through the semiconductor wafer according to FIG. 2 after thinning the semiconductor wafers;

FIG. 4 shows a schematic cross section through the thinned semiconductor wafer according to FIG. 3 after applying a fragile adhesive film;

FIG. 5 shows a schematic cross section through the fragile adhesive film according to FIG. 4 after breaking the adhesive film;

FIG. 6 shows a schematic cross section through the fragile adhesive film according to FIG. 4 and a device for breaking out individual semiconductor chips with a back-side film.

DETAILED DESCRIPTION

Figure 7:
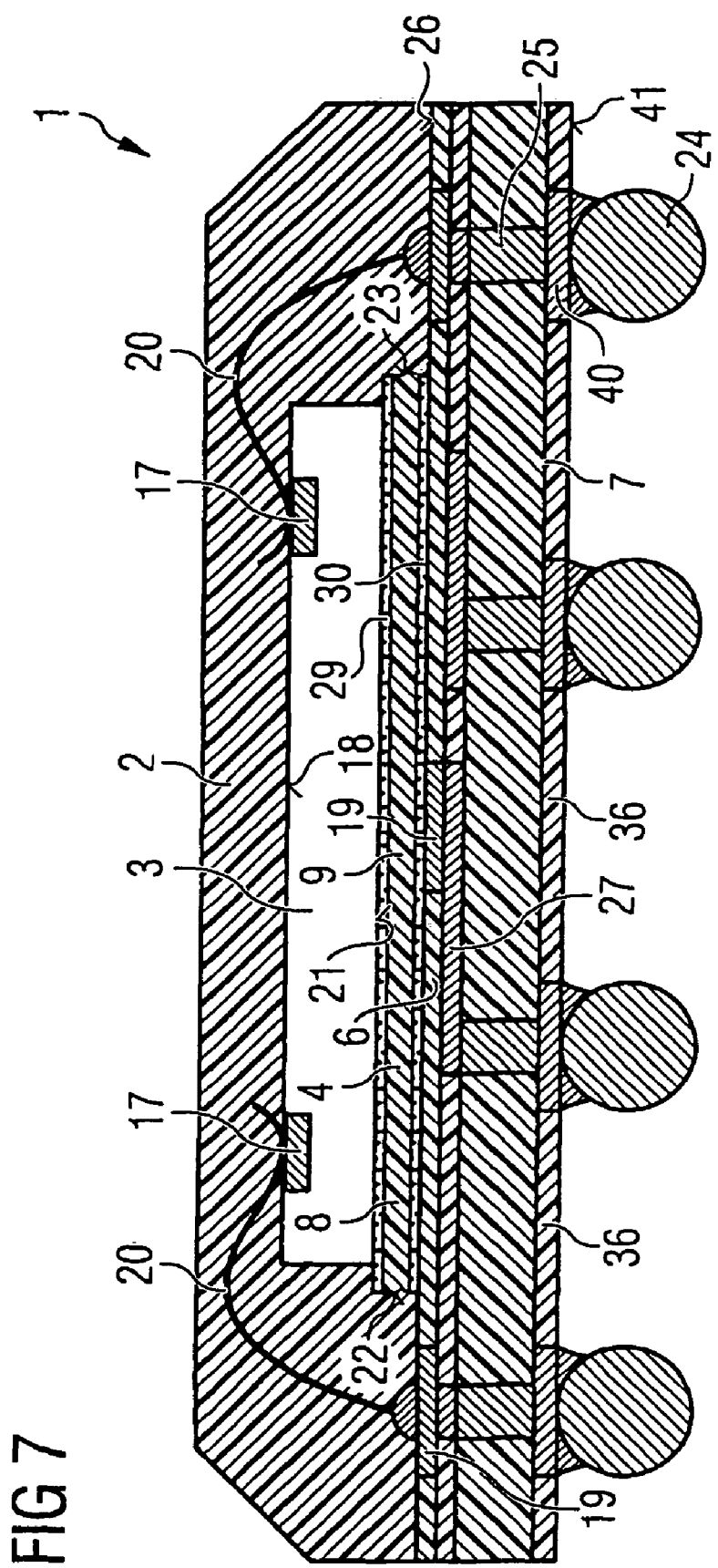
FIG. 7 shows a schematic cross section through a semiconductor device of one embodiment.

A semiconductor device with a semiconductor chip includes an adhesive film positioned between the back side of the semiconductor chip and a chip pad of a leadframe. The adhesive film includes an adhesive layer on both sides of a film core, the film core being a brittle, fragile material.

For a semiconductor device, such a fragile material that is provided with adhesive layers on both sides provides an advantage in that the adhesive film, disposed between the back side of the semiconductor chip and a chip pad of a leadframe, possesses the property that as the brittleness increases, the coefficient of thermal expansion also becomes increasingly similar to that of the semiconductor chip material. Consequently, shear loads that act from a chip pad on a leadframe of plastic material will have an effect in the brittle, fragile material that potentially lead to microcracks in the adhesive film, but protect the semiconductor chip from such damage. One particular advantage of a brittle, fragile material with adhesive layers on both sides is obtained if the leadframe is made of metal or ceramic.

In this case, the differences in the coefficient of thermal expansion between the brittle, fragile material and the metal or the ceramic material are negligible, such that reduced shear stresses occur at these boundary surfaces. To achieve the high degree of brittleness, a high level of filler f is favorable, in the range of 92% by volume $\leq f \leq$ 98% by volume. If the adhesive film is at the same time to be electrically conductive, the filler is provided with electrically conductive particles that permit high electrical conductivity. With the high level of filler, a thermoplastic can be used as the bonding adhesive compound. In order to increase the brittleness of the material still further, it is advantageous to provide a thermosetting material, with then electrically conductive filler particles, as the film core. The high degree of crosslinkage of a thermosetting material at the same time increases the brittleness of such a film core.

The advantage of the semiconductor device or the adhesive film of a brittle, fragile material is, however, that the production of such semiconductor devices can be simplified, since the brittle fragile material can be broken through with little expenditure of force along separating joins between individual semiconductor chips by bending or stamping. Consequently, the back-side film produced as a result on individual semicondutor chips has on its edge sides breakage contours which are an indication that no sawing techniques or laser ablation techniques were used. Therefore, the aforementioned disadvantages, experienced in the sawing and laser ablation techniques, of contamination resulting from machined or evaporated adhesive film material are avoided.

The fragile adhesive film is preferably used as a back-side film for semiconductor devices which have a thinned semiconductor chip, especially since the thinning of the semiconductor material causes it to lose its brittleness, and consequently the semiconductor chip itself is not damaged when the film is broken through via bending techniques and/or stamping techniques, since the brittle, fragile adhesive film breaks first.

An apparatus for producing a semiconductor device with a semiconductor chip and a fragile adhesive film on the back side of the semiconductor chip includes an edge bending device. Such an edge bending device breaks the fragile adhesive layer at the bending edge along separating joins between the semiconductor chips on the back sides of semiconductor chips arranged in rows and columns. Furthermore, the apparatus has a pick-and-place machine, which fixes the semiconductor chips with the adhesive film arranged on the back side on a leadframe in semiconductor device positions with chip pads of the leadframe. Such an apparatus has the advantage that it performs a purely mechanical separation by bending over a bending edge, such that no contamination can occur as a result of machined or evaporated adhesive film material.

A further apparatus for producing a semiconductor device with a semiconductor chip and a fragile adhesive film on the back side of the semiconductor chip includes a holder for a semiconductor wafer with semiconductor chips arranged in rows and columns and includes a punch, which corresponds in the extent of its surface area to the back side of a semiconductor chip. The punch can be moved orthogonally in relation to the semiconductor chip. On the side opposite from the holder, the apparatus includes a template with a template opening. The template opening corresponds in the extent of its surface area to the surface area of an individual semiconductor chip. In this case, the template partially covers the upper side of the semiconductor wafer separated into semiconductor chips. For separating the fragile adhesive film, the punch is pushed in relation to the template through the template opening, thereby breaking through the adhesive film.

On the side of the template opening, the apparatus has a vacuum pipette tip, which corresponds to the extent of the surface area of the upper side of an individual semiconductor chip and receives the latter on its back side when it is broken out from the fragile adhesive film with a broken-out piece of adhesive film. Apart from these components for breaking out and receiving the semiconductor chips with back-side fragile adhesive film, the apparatus has a pick-and-place machine, which fixes the semiconductor chips with the back-side fragile adhesive film on a leadframe in semiconductor device positions with chip pads of the leadframe.

This apparatus has the advantage that the device for singulating a piece of film with a semiconductor chip located on it can already be part of the pick-and-place machine. Furthermore, the apparatus permits rapid separation of individual functional chips from a multiplicity of semiconductor chips of a semiconductor wafer separated into semiconductor chips.

A method is described below for producing a plurality of semiconductor chips with fragile adhesive films on the back sides. First, a semiconductor wafer with a multiplicity of semiconductor device positions arranged in rows and columns is produced. Subsequently, the semiconductor wafer is applied with its back side to a carrier film. Then separating joins are introduced along the semiconductor device positions from the upper side of the semiconductor wafer in the semiconductor device positions, the separating joins not completely severing the semiconductor wafer.

Subsequently, the not completely severed semiconductor wafer is adhesively attached with its upper side and the separating joins onto a semiconductor wafer carrier. After removal of the carrier film, the back side of the semiconductor wafer is then available for further processing. From the back side, the semiconductor wafer can then be thinned to the separating joins. As soon as the separating joins are reached, the semiconductor wafer is separated into individual thinned semiconductor chips. This is followed by the application of a fragile adhesive film to the back side of the semiconductor wafer separated into semiconductor chips.

In this case, the fragile adhesive film with its hard material core is not yet singulated, but contiguous, and covers the entire back side of the semiconductor wafer separated into semiconductor chips. This is followed by the singulation of the semiconductor chips to form semiconductor chips with a piece of adhesive film by severing the adhesive film along the separating joins. Singulating the semiconductor chips can be performed in various ways. In a first embodiment, the fragile film is broken along the separating joins over a bending edge of a bending device, and the semiconductor chips are singulated in this way. Alternatively, a punch, that is adapted to the surface area of an individual semiconductor chip and moves orthogonally in relation to the semiconductor chip, breaks through the fragile film, thereby singulating the semiconductor chips with pieces of fragile adhesive film. In both embodiments, breakage contours of the adhesive film are produced at the edges of the piece of fragile adhesive film.

A method is described below for producing a plurality of semiconductor devices with semiconductor chips and pieces of fragile adhesive film between the back side of the semiconductor chips and a chip pad of a leadframe. First, a leadframe with a number of semiconductor device positions is provided. Then, in a pick-and-place machine, the semiconductor chips with their fragile adhesive films can be applied to this leadframe in the respective semiconductor device positions on corresponding chip pads which are provided on the leadframe.

Subsequently, the contact areas on the upper side of the semiconductor chips are electrically connected to corresponding contact pads of the leadframe in the semiconductor device positions via connecting elements. Then, the connecting elements of the semiconductor chips with the back-side film and, to a partial extent, the leadframe are embedded in a plastic package molding compound. Subsequently, the leadframe can then be divided up into individual semiconductor devices.

In comparison with the previous methods, it is possible with this method to dispense with expensive installations to singulate the semiconductor chips with a back-side film. In addition, no residues or contaminants remain on the chip edges, as is the case with laser ablation and/or the sawing techniques.

Exemplary embodiments are now described in connection with the figures. FIG. 1 shows a schematic cross section through a semiconductor wafer 10 with semiconductor device positions 11 after the introduction of separating joins 14. For this purpose, the semiconductor wafer 10 is fixed with its back side 12 on a carrier film 13, so that its upper side 15 is freely accessible. From the upper side 15, the separating tracks 14 are introduced to a depth t, which does not completely sever the semiconductor wafer 10 but is at least of the same magnitude as the thickness d of semiconductor chips 3 to be produced. The semiconductor chips 3 are schematically represented by dotted lines and include upper sides 18 disposed on the upper side 15 of the semiconductor wafer 10. Contact areas 17 are arranged on upper sides 18 of the semiconductor chips 3. The semiconductor chips 3 also include back sides 5 that are not yet exposed.

FIG. 2 shows a schematic cross section through the semiconductor wafer 10 according to FIG. 1 after application of the semiconductor wafer 10 to the upper side 28 of a semiconductor wafer carrier 16. The semiconductor wafer 10 is applied with its active upper side 15 to the semiconductor wafer carrier 16, thereby covering the upper sides 18 of the semiconductor chips and the separating joins 14. Subsequently, the carrier film 13, shown in FIG. 1, is removed from the back side 12 of the semiconductor wafer 10. Thereby, the back side 12 is exposed, such that the semiconductor wafer 10 can be thinned from the back side 12.

FIG. 3 shows a schematic cross section through the semiconductor wafer 10 according to FIG. 2 subsequent to thinning the semiconductor wafer 10. The thinning of the semiconductor wafer 10 has the effect that individual semiconductor chips 3 are then arranged with their upper side 18 on the semiconductor wafer carrier 16 and the separating joins 14 completely separate the semiconductor chips 3 from one another. Consequently, the back sides 5 of the semiconductor chips 3 are accessible for further processing steps.

FIG. 4 shows a schematic cross section through the thinned semiconductor wafer 10 after application of a fragile adhesive film 4. This fragile adhesive film 4 comprises a brittle adhesive film core 9 and is coated on both sides with adhesive layers 29 and 30. While the adhesive layer 29, arranged on the upper side 21 of the adhesive film 4, fixes the back sides 5 of the semiconductor chips 3, the adhesive layer 30 on the underside 37 of the adhesive film 4 is free for fixing the combination comprising the semiconductor chip 3 and the piece of back-side film 8 on a chip pad of a leadframe.

Subsequent to thinning the semiconductor wafer, the fragile adhesive film 4 fixed to back sides 5 of the semiconductor chips 3 is prepared to be singulated into individual pieces of back-side film 8 fixed to the individual backsides 5 of the individual semiconductor chips 3. On account of the fragility and the brittleness of the film core 9, even low forces are adequate to achieve a break along the separating joins 14 of the adhesive film 4. The high degree of brittleness of the adhesive film core 9 is achieved by the high level of filler of 92% by volume $\leq f \leq 98\%$ by volume. In this case, metal particles, for example of silver, are used as the filler for an electrically conductive adhesive film.

FIG. 5 shows a schematic cross section through the fragile adhesive film 4 according to FIG. 4 after breaking the adhesive film 4 along the separating joins 14. In this example, the adhesive film 4 was subjected to bending stress in the indicated directions of the arrows A and B, such that breakage lines 38 form through the film core 9 along the separating joins 14, leading to row-by-row singulation of the semiconductor chips 3. By corresponding bending stress, the rows can then in turn be broken into individual semiconductor chips including an adhesive piece of back-side film 8.

FIG. 6 shows another possibility for the singulation. FIG. 6 shows a schematic cross section through the fragile adhesive film 4 according to FIG. 4 and a device 39 for breaking out individual semiconductor chips 3 with pieces of back-side film 8. For this purpose, the device 39 has a holder 31, which at least partially supports the semiconductor wafer that is separated into individual chips 3 and attached on an adhesive film. A punch 32, which corresponds in the extent of its surface area to the surface area of a semiconductor chip 3, can be moved through the holder 31 in the direction of the arrow C. Attached on the upper side 18 of the semiconductor chips 3 is a covering template 33, which has a template opening 34, which corresponds in the extent of its surface area to the size of a semiconductor chip 3.

Through this template opening 34, the semiconductor chip 3 can then be broken out from the fragile adhesive film 4 when the punch 32 is raised in the direction C, a breakage contour forming at the edge sides 22 and 23 of the piece of back-side film 8, and the semiconductor chip 3 with the piece of back-side film 8 being raised to the extent that a vacuum pipette tip 35 of a pick-and-place machine, which has a base area of the order of magnitude of the semiconductor chip 3, can take over the semiconductor chip 3 with the piece of back-side film 8 and apply the semiconductor chip 3 to a corresponding chip pad of a leadframe.

FIG. 7 shows a schematic cross section through a semiconductor device 1 according to one embodiment. In order to produce such a semiconductor device 1, the semiconductor chip 3 with the piece of back-side film 8 is applied to the chip pad 6 of a leadframe 7 with a wiring structure 27, and the contact areas 17 on the upper side 18 of the semiconductor chip 3 are electrically connected to contact pads 19 on the upper side 26 of the leadframe 7 via connecting elements 20, which in this case are bonding wires. The contact pads 19 in this example are connected via contact vias 25 to external contact areas 40, which bear external contacts 24 in the form of solder balls, the external contact areas 40 being surrounded by a solder resist layer 36.

It is characteristic of the semiconductor device 1 that the edge sides of the adhesive film 22 and 23 have breakage contours. It is also characteristic of the semiconductor device 1 that the adhesive film 4 is made from a filled, brittle and fragile material. After attaching the connecting elements 20, the semiconductor chip 3, the connecting elements 20 and parts of the upper side 26 of the leadframe 7 can then be embedded in a plastic package molding compound 2. Since all the external contacts 24 in this embodiment are arranged on the underside 41 of the semiconductor device 1, the semiconductor device is surface-mountable.

While the device has been described in detail with reference to specific embodiments thereof, it will be apparent to one of ordinary skill in the art that various changes and modifications can be made therein without departing from the spirit and scope thereof. Accordingly, it is intended that the present device covers the modifications and variations of this device provided they come within the scope of the appended claims and their equivalents.

LIST OF REFERENCE SIGNS 1 semiconductor device
2 plastic package molding compound
3 semiconductor chip
4 adhesive film
5 back side of the semiconductor chip
6 chip pad
7 leadframe
8 piece of back-side film
9 film core
10 semiconductor wafer
11 semiconductor chip position
12 back side of the semiconductor wafer
13 carrier film
14 separating join
15 upper side of the semiconductor wafer
16 semiconductor wafer carrier
17 contact area of the semiconductor chip
18 upper side of the semiconductor chip
19 contact pad
20 connecting element
21 upper side of the adhesive film
22 edge side of the adhesive film
23 edge side of the adhesive film
24 external contact
25 contact via
26 upper side of the leadframe
27 wiring structure
28 upper side of the semiconductor wafer carrier
29 first adhesive layer of the adhesive film
30 second adhesive layer of the adhesive film
31 holder
32 punch
33 covering template
34 template opening
35 vacuum pipette tip
36 solder resist layer
37 underside of the adhesive film
38 breakage line
39 device
40 external contact area
41 underside of the semiconductor device
A direction of arrow
B direction of arrow
C direction of arrow
d thickness of the semiconductor chip
t depth of the separating tracks

What is claimed is:

1. A method for producing a plurality of semiconductor chips including fragile adhesive film on back sides of the semiconductor chips, the method comprising:
   producing a semiconductor wafer including a plurality of semiconductor chip positions arranged in rows and columns;
   applying a back side of the semiconductor wafer to a carrier film;
   introducing separating joins along the semiconductor chip positions into the upper side of the semiconductor wafer, the separating joins not completely severing the semiconductor wafer;
   adhesively attaching a semiconductor wafer carrier to an upper side of the, not completely severed, semiconductor wafer;
   thinning the back side of the semiconductor wafer to the separating joins such that the semiconductor chip positions are separated along the back sides;
   applying a fragile adhesive film to the back sides of the separated semiconductor chip positions; and
   singulating the separated semiconductor chip positions, via severing the fragile adhesive film along the separating joins, thereby forming semiconductor chips including respective pieces of fragile adhesive film.

2. The method as claimed in claim 1, wherein the severing of the fragile adhesive film along the separating joins is performed via bending the fragile adhesive film over a bending edge of a separating device.

3. The method as claimed in claim 1, wherein the severing of the fragile adhesive film along the separating joins is performed via a stamping punch that interacts with a template opening of a covering template and transfers the semiconductor chip to a vacuum pipette, thereby severing the fragile adhesive film and pushing the semiconductor chip including a piece of fragile adhesive film through the template opening.

4. A method for producing a plurality of semiconductor devices with semiconductor chips and adhesive films between back sides of the semiconductor chips and chip pads of a leadframe, the method comprising:
   producing a semiconductor wafer including a plurality of semiconductor chip positions arranged in rows and columns;
   applying a carrier film to a back side of the semiconductor wafer;
   introducing separating joins along the semiconductor chip positions into an upper side of the semiconductor wafer, the separating joins not completely severing the semiconductor wafer;
   adhesively attaching a semiconductor wafer carrier to the upper side of the not completely severed semiconductor wafer;
   thinning a back side of the semiconductor wafer to the separating joins, thereby separating the semiconductor wafer into a plurality of semiconductor chips that are attached to the wafer carrier;
   applying a fragile adhesive film to the back side of the plurality of semiconductor chips;
   singulating the plurality of semiconductor chips via severing the fragile adhesive film along the separating joins, thereby forming a plurality of semiconductor chips including a piece of fragile adhesive film;
   removing the semiconductor chips including a piece of fragile adhesive film from the semiconductor wafer carrier and arranging the semiconductor chips in semiconductor device positions of the leadframe;
   connecting contact areas on the upper side of the semiconductor chip to contact pads of the leadframe via connecting elements;
   packaging the connecting elements, the semiconductor chips including the pieces of fragile adhesive film and at least part of the leadframe in a plastic package molding compound; and
   separating the leadframe into individual semiconductor devices.

5. The method as claimed in claim 4, wherein the severing of the fragile adhesive film along the separating joins is performed via bending the fragile adhesive film over a bending edge of a separating device.

6. The method as claimed in claim 4, wherein the severing of the fragile adhesive film along the separating joins is performed via a stamping punch that interacts with a template opening of a covering template and transfers the semiconductor chip to a vacuum pipette, thereby severing the fragile adhesive film and pushing the semiconductor chip including a piece of fragile adhesive film through the template opening.

* * * * *